(12) United States Patent
Yang (10) Patent No.: US 8,444,867 B2
(45) Date of Patent: May 21, 2013

(54) METHOD FOR FABRICATING PATTERNS ON A WAFER THROUGH AN EXPOSURE PROCESS

(75) Inventor: Hyun Jo Yang, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 840 days.

(21) Appl. No.: 12/582,530

(22) Filed: Oct. 20, 2009

(65) Prior Publication Data

US 2010/0279505 A1  Nov. 4, 2010

(30) Foreign Application Priority Data

Apr. 30, 2009  (KR) .................. 10-2009-0038126

(51) Int. Cl.
  *C03C 25/68*  (2006.01)
(52) U.S. Cl.
  USPC .................. 216/41; 216/46; 216/47; 216/49; 216/79
(58) Field of Classification Search
  USPC ..................... 216/41, 46, 47, 49, 79
  See application file for complete search history.

(56) References Cited

U.S. PATENT DOCUMENTS

| | | | |
|---|---|---|---|
| 5,246,468 A * | 9/1993 | Takahashi et al. | 29/25.01 |
| 2003/0124944 A1* | 7/2003 | Kyogaku et al. | 445/6 |
| 2004/0101786 A1* | 5/2004 | Meagley | 430/322 |
| 2005/0287722 A1* | 12/2005 | Zhang | 438/149 |
| 2006/0078828 A1* | 4/2006 | Atkinson et al. | 430/313 |
| 2007/0048668 A1 | 3/2007 | Liegl | |
| 2008/0160779 A1 | 7/2008 | Detweiler et al. | |
| 2008/0296591 A1* | 12/2008 | Lin et al. | 257/88 |

FOREIGN PATENT DOCUMENTS

| | | |
|---|---|---|
| JP | 04-315432 A | 11/1992 |
| KR | 10-0955670 | 4/2008 |

* cited by examiner

*Primary Examiner* — Binh X Tran
(74) *Attorney, Agent, or Firm* — Marshall, Gerstein & Borun LLP (57) ABSTRACT

A method for forming patterns on a wafer includes forming a fence having a sloped face in an edge portion of the wafer. The sloped face is direct to an inside of the wafer. A first photoresist layer is formed which extends to cover the fence on the wafer. First photoresist patterns are formed by performing a first exposure and development on the first photoresist layer. An etch process is performed using the first photoresist patterns and the fence as an etch mask. The fence is formed by selectively exposing a negative resist using a light shielding blade, and at this time, the first photoresist layer is formed including a positive resist.

20 Claims, 13 Drawing Sheets

METHOD FOR FABRICATING PATTERNS ON A WAFER THROUGH AN EXPOSURE PROCESS

CROSS-REFERENCE TO RELATED APPLICATIONS

Priority to Korean patent application number 10-2009-0038126, filed on Apr. 30, 2009, the entire disclosure of which is incorporated by reference is claimed.

BACKGROUND

The disclosure relates generally to a semiconductor device, and more particularly, to a method for fabricating patterns on a wafer through an exposure process.

A photolithography process is performed to integrate a semiconductor device on a wafer. A photoresist pattern is formed by transferring a layout of a circuit pattern formed on a photomask onto a photoresist layer on the wafer through an exposure process, and a wafer pattern according to the layout of the designed circuit pattern is formed by a patterning process including an etch process using the photoresist pattern as an etch mask.

Figure 1:
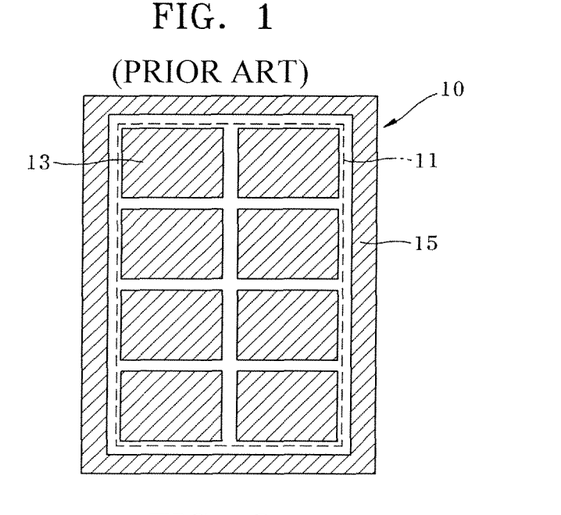
FIG. 1 is a view illustrating a photomask used in a photolithography process.
Figure 2:
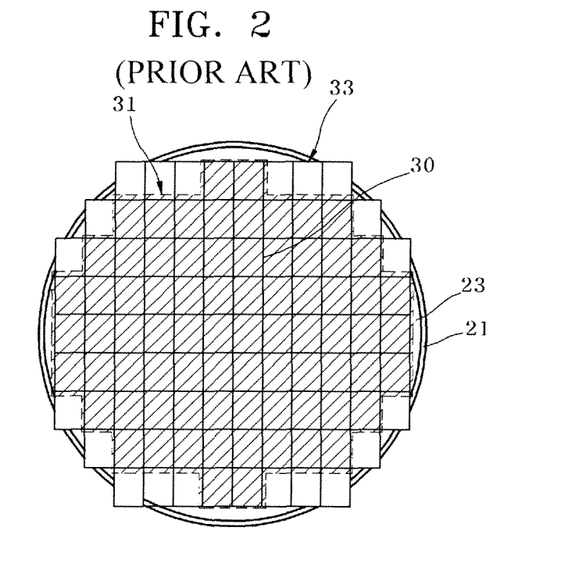
FIG. 2 is a wafer map illustrating a field on which an exposure shot is performed in an exposure process.

FIG. 1 illustrates a photomask used in the photolithography process. Referring to FIG. 1, a photomask 10 is fabricated in a rectangular or tetragonal shape and is provided with a mask field region 11 as a region to be exposed. Die regions 13 are disposed within the mask field region 11. The die regions 13 are disposed with mask patterns according to the layout of designed circuit patterns. A frame region 15 is disposed as a light shielding region around the field region 11. Since the mask field region 11 disposed with the die regions 13 is of a rectangular or tetragonal shape, an exposure field region 30 exposed on a photoresist layer 23 on a wafer 21 upon a single exposure shot comes to have a rectangular or tetragonal shape according to the shape of the mask field region 11, as illustrated in FIG. 2.

Since the wafer 21 is formed in a circular shape, an entire mask field region 11 may be fully transferred to the exposure field region 30 in the middle of the wafer 21 by the exposure shot in a full field region 31 placed in the middle of the wafer 21. On the other hand, the entire mask field region 11 is not fully transferred at a peripheral edge portion of the wafer, but is partially transferred by the exposure shot in a partial field region 33 placed at the peripheral edge portion of the wafer 21. Since the mask field region 11 cannot be fully pattern-transferred in this partial field region 33, the exposure shot on this partial field region 33 is not performed and the device integration in the wafer 21 is limited to the full field region 31 or the middle part of the wafer 21. Since an increase in yield of the number of devices per wafer 21 can be expected when the exposure pattern transfer is performed in the partial field region 33, there has been studied a method for realizing the pattern transfer on the partial field region 33 by exposure.

However, when performing the pattern transfer by processing the exposure shot to the partial field region 33, wafer pattern defects are generated in the partial field region 33 and poor patterns due to these pattern defects can function as particles in the subsequent processes, which are factors causing other defects on the entire wafer 21. Observation shows that this pattern defect results from the exposure defect caused upon the exposure on the partial field region 33. For example, when performing the exposure on this partial field region 33 in a process for forming a storage node of a capacitor of a semiconductor device such as a DRAM memory device, it can be seen that defects and faults are generated in the storage nodes 61 as illustrated in FIG. 3.

Figure 3:
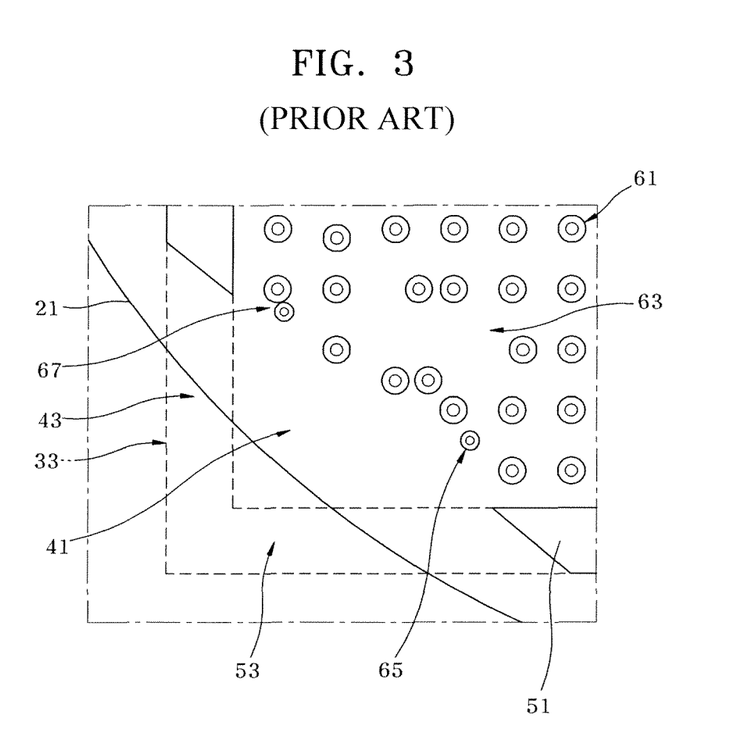
FIG. 3 is a view illustrating a storage node defect generated in an edge portion of a wafer.

Referring to FIG. 3, it can be experimentally confirmed that a defect 63 of loss of the storage node 61, a defect 65 of downsizing of the storage node 61, a defect 67 of connection of adjacent storage nodes 61 or other defects are generated when transferring a photomask for forming the storage node 61 on the partial field region 33 on the wafer 21 by the exposure. Further, it has been confirmed that a defect of loss of an insulation layer 51 may occur in a peripheral region 43 around a cell region 41 in which the storage nodes 61 are formed. To ensure more capacitance of the capacitor of the DRAM device in a limited area, the storage node 61 is formed in a pillar shape, such as a circular pillar and a cylindrical pillar, electrically connected to a transistor device. The storage node 61 is formed in a pillar shape having a very large height as compared to a bottom area to increase an effective area of a dielectric layer, and thus a minute pattern defect generated in the exposure process can result in a serious defect in the shape of the storage node 61.

As described above, since the pattern transfer by the exposure on the partial field region 33 has many defect factors including the storage node defects 63, 65, 67, there has been desired a development of a method of integrating a semiconductor device in the partial field region 33 by transferring patterns with generation of the pattern defects being restricted in the partial field region 33.

SUMMARY

Embodiments of the invention are directed to a method for fabricating patterns capable of fabricating wafer patterns such as a storage node while restricting pattern defects in a partial region in an edge region of a wafer.

In one aspect, a method for forming patterns on a wafer includes forming a fence having a sloped face in an edge portion of the wafer, forming a first photoresist layer which extends to cover the fence, on the wafer, forming first photoresist patterns by performing a first exposure and development on the first photoresist layer, and performing an etch process using the first photoresist patterns and the fence as an etch mask. The sloped face is directed to an inside of the wafer.

In another aspect, a method for forming patterns on a wafer includes forming a first photoresist layer on the wafer, providing the wafer below a lens part of an exposure equipment, providing a light shielding blade for opening an edge portion of the wafer above the lens part, forming a fence in an edge portion of the wafer by performing a first exposure which results in a defocus to the first photoresist layer by providing an exposure light through the light shielding blade, forming a second photoresist layer on the wafer formed with the fence, forming second photoresist patterns by performing a second exposure and development on the second photoresist layer, and performing an etch process using the second photoresist patterns and the fence. The fence includes a sloped face directed to an inside of the wafer, In a further aspect, a method for forming patterns on a wafer includes forming a sacrificial layer to provide a pillar shape to a storage node on the wafer, forming a first photoresist layer on the sacrificial layer, providing the wafer below a lens part of an exposure equipment, providing a light shielding blade for opening an edge portion of the wafer above the lens part, forming a fence in an edge portion of the wafer by performing a first exposure which results in a defocus to the first photoresist layer by providing an exposure light through the light shielding blade, forming a second photoresist layer on the wafer formed with the fence, forming second photoresist patterns by performing a second exposure and development on the second photoresist layer, forming opening holes passing through the sacrificial layer by performing an etch process using the second photoresist patterns and the fence, and forming storage nodes according to a profile of the opening hole. The fence includes a sloped face directed to an inside of the wafer.

Preferably, forming the fence includes forming the fence to include a second photoresist which resists the development of the first photoresist layer and is not developed when the first photoresist pattern is developed.

Preferably, the second photoresist includes a negative resist and the first photoresist layer includes a positive resist.

Preferably, performing a second exposure includes performing a second exposure which intentionally induces the defocus to a value larger than a thickness of the second photoresist layer.

Preferably, performing a second exposure includes performing a second exposure which intentionally induces the defocus to a range of several millimeters.

Preferably, providing a light shielding blade comprises providing a light shielding blade including two blade parts which control a width of a portion to be formed with the fence with an opened region.

Preferably, performing the second exposure includes performing the second exposure by excluding the introduction of a photomask between the light shielding blade and the lens part, and increasing the defocus by a spacing between the introduction position of the light shielding blade and a position to be introduced with the photomask.

Preferably, forming the fence includes forming a second photoresist layer on the wafer, preparing a photomask including a mask field region to be pattern transferred on the first photoresist layer, setting, on the basis of the wafer, a map of exposure field regions to which an exposure shot on the mask field region is to be performed upon the first exposure, dividing the exposure field regions to full field regions on which the entire mask field region is to be fully transferred and partial field regions on which some is to be transferred, and performing a second exposure on the second photoresist layer so that the fence is disposed in the vicinity of the edge end of the wafer in the partial field region.

Preferably, performing the first exposure comprises performing the first exposure no that the entire mask field region is transferred on the partial field region by one exposure shot.

Preferably, forming storage nodes comprises forming a storage node including a cylindrical pillar shape according to the profile of the opening hole or a circular pillar shape which fills the opening hole.

Embodiments of the present invention can provide a method for fabricating patterns capable of fabricating wafer patterns such as a storage node while restricting pattern defects in a partial region in an edge region of a wafer.

DETAILED DESCRIPTION

Hereinafter, a method for fabricating a photomask will be described in detail with reference to the accompanying drawings.

In the disclosed techniques, pattern transfer is performed, by performing an exposure shot using a photomask on a partial field region in an edge region of a wafer, in which a wafer region corresponding to an exposure field region of a photomask is just partially ensured. At this time, to prevent generation of exposure failure upon the pattern transfer, a fence for inhibiting the pattern transfer is introduced in the edge region of a wafer corresponding to the partial field region so that failure in the pattern transfer is prevented upon the exposure. This fence can be formed by separate first photoresist layer coating and first exposure processes. A second photoresist layer is coated to cover the fence. A pattern for a wafer pattern to be realized on the wafer is to be exposed by a second exposure on the second photoresist layer In order to prevent a sharp increase in the thickness of the coated second photoresist layer in the vicinity of the fence by a height difference resulting from the introduction of the fence, the fence is formed so as to have a sloped face with a gentle slope directed to the middle of the wafer. The sloped face of the fence has the slope which can reduce a fluctuation of the thickness of the second photoresist layer For example, the sloped face of the fence is gently formed so as to have a slope less than about 45°.

By introducing the fence to prevent forming of a wafer pattern by the exposure in the edge region of the wafer in which the fence is placed, it is possible to prevent the pattern transfer failures from being generated in the edge of the wafer. Also, since the fence has the sloped face directed to the inside of the wafer, it is possible to prevent fluctuation in the thickness of the second photoresist layer in a region in the vicinity of the fence and thus prevent exposure failure and pattern defects due to thickness fluctuation. These techniques can be effectively employed to form a storage node having a pillar shape, such as a cylindrical pillar and a circular pillar, in the partial field region in the edge region of the wafer.

Although a process of forming a storage node of a capacitor of a DRAM device is disclosed, the techniques can be modified to a process of forming a wafer pattern other than the storage node if a process of transferring the pattern on the partial field region in the edge portion of the wafer by an exposure process is included.

Figure 4:
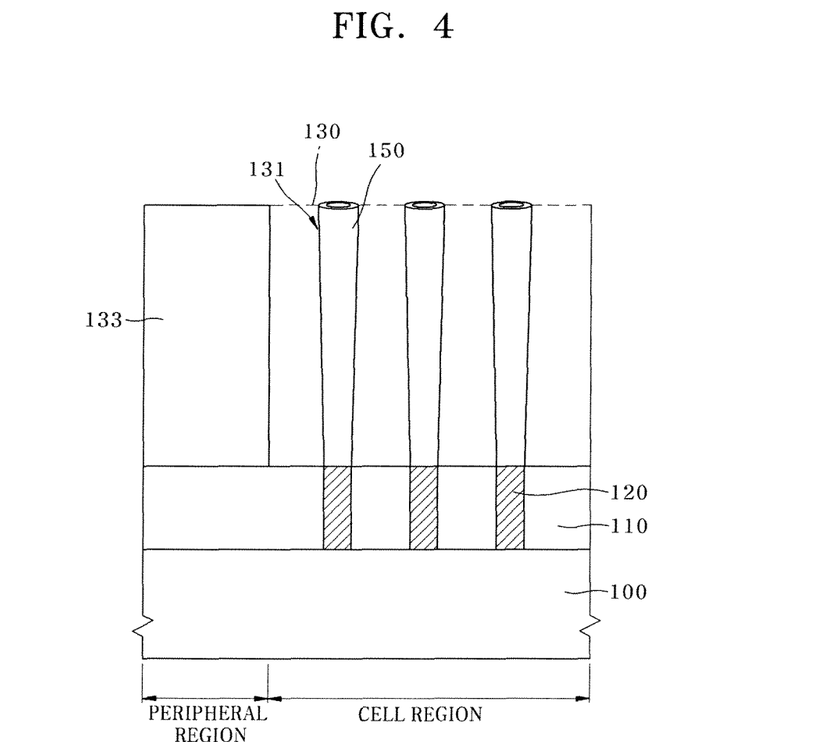
FIG. 4 is an exemplary view illustrating a shape of a storage node.

Referring to FIG. 4, a memory cell of a semiconductor device such as a DRAM includes a cell transistor (not illustrated) and a cell capacitor (not illustrated) which are integrated on a silicon wafer 100. In order to improve a capacitance of the cell capacitor, there is introduced a process of forming the storage node 150 in a three dimensional shape having a pillar shape, such as a cylindrical shape and a circular shape. The storage node 150 is formed to be aligned and connected with a storage node contact 120, which passes through an interlayer insulation layer 110, so as to be electrically connected with the cell transistor. A sacrificial layer 130 for inducing the storage node to have a pillar shape is introduced and an opening hole 131, which passes through the sacrificial layer 130, is formed at a position to be formed with the storage node 150. The storage node 150 is formed to fill the opening hole 131 and a portion of the sacrificial layer 130 adjacent to the storage node 150 is selectively removed to expose an outer wall of the storage node 150. At this time, the portion of the sacrificial layer 130 placed on the peripheral region is retained as a remaining insulation layer 133 so as to reduce the height difference between the cell region and the peripheral region, and prevent the storage nodes 130 from falling down or moved during the process of removing the sacrificial layer 130. Further disclosed techniques will be described in conjunction with the process of forming the storage node 150.

Figure 5:
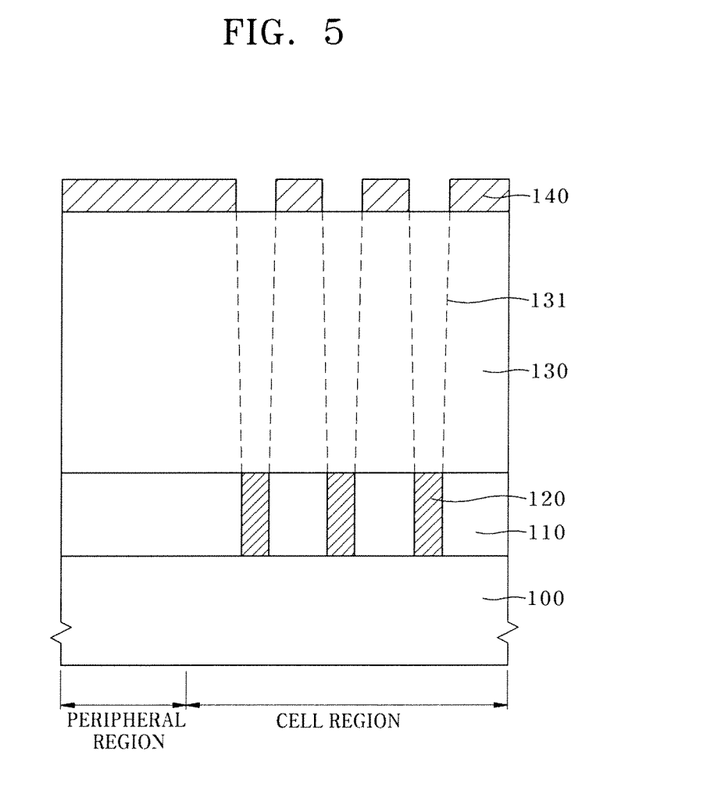
FIGS. 5 and 6 are exemplary views illustrating a storage node mask.

Referring to FIG. 5, a cell transistor (not illustrated) which constitutes a memory cell of a DRAM device is formed in the cell region on the wafer 100, and the interlayer insulation layer 110 which covers the cell transistor is formed of an insulation material such as silicon oxide ($SiO_2$). The storage node contact 120 which passes through the interlayer insulation layer 110 and is electrically connected to the cell transistor is formed of a conductive material such as conductive polysilicon, and the sacrificial layer 130 for the mold which gives a pillar shape to the storage node is formed of an insulation material such as silicon oxide. A process of forming an etch mask 140 for selectively etching the opening hole 131 on this sacrificial layer 130 is performed by a photolithography process.

Figure 6:
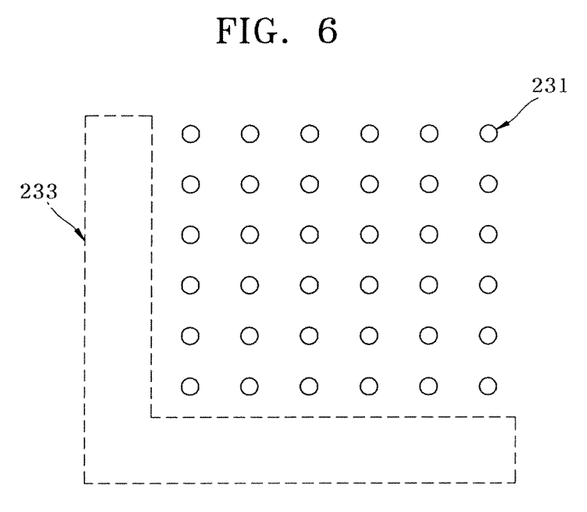

A mask layout to be pattern transferred on the photoresist layer to form the etch mask 140 is obtained so that hole patterns 231 corresponding to the opening holes 131 are disposed therein, as illustrated in FIG. 6. At this time, an outside portion 233 of the hole patterns 231 corresponds to the remaining insulation layer 133, and the hole patterns 231 are not disposed in the outside portion 233. A photomask is provided with mask patterns according to the layout of the hole pattern 231. At this time, the photomask is fabricated so that a mask field region 11 and a die region 13 are disposed in the entire region of the mask and the entire mask region is used in the exposure process as illustrated in FIG. 1. When pattern transferring the layout of the hole pattern 231 on the wafer 100 using this photomask, it is not possible, as described with reference to FIG. 2, to pattern transfer the entire mask field region 11 and die region 13 exposure shot on the partial field region 33. Therefore, storage node defects 63, 65, 67 and a portion 53 in which the insulation layer is lost are generated as described with reference to FIG. 3. In the disclosed techniques, there is introduced a process of forming a fence prior to exposure transfer the hole patterns 231 to inhibit the pattern defect in this partial field region 33.

As described with reference to FIG. 3, the generation of the storage node defects 63, 65, 67 is related to a phenomenon that an edge portion of the wafer (21 of FIG. 3) is opened by the portion 53 in which the insulation layer is lost. When the entire mask region including the mask field region 11 and the die region 13 is exposure transferred as illustrated in FIG. 1, only some portion of the die region 13 is pattern transferred on the partial field region by the insufficient area, and thus the insulation layer 51 cannot be maintained in the outside portion of the storage nodes 61 as illustrated in FIG. 3. In disclosed techniques, the fence is introduced prior to the exposure process so that the insulation layer 51 is retained in the outer edge of this partial field region, thereby inducing actual inhibition or exclusion of the pattern transfer on this fence portion. Therefore, the sacrificial layer (130 of FIGS. 4 and 5) is induced to remain as the remaining insulation layer in the subsequent process.

Figure 7:
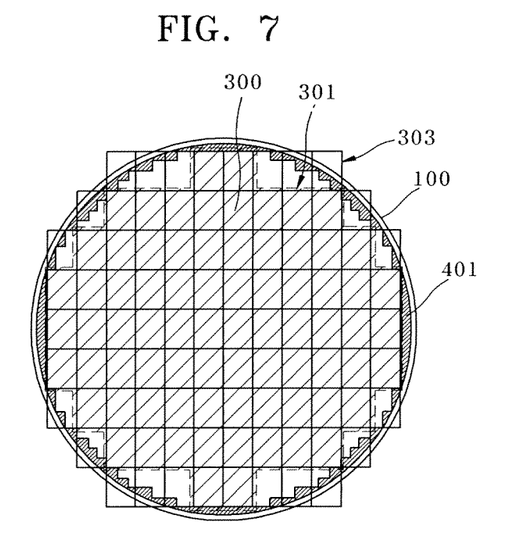
FIGS. 7 to 9 are exemplary views illustrating a pattern inhibition fence.

Referring to FIG. 7, a map of exposure field regions 300 on which the exposure shot is performed is set on the wafer 100, and a full field region 301 on which the entire mask field region (11 of FIG. 1) is fully transferred and a partial field region 303 in the outer edge portion is accordingly set. A fence region 401 is set in the periphery of the wafer 100 so that the fence region 401 extends to overlap with the periphery of the partial field region 303. The fence region 401 is set as the region on which the pattern transfer by exposure is inhibited or excluded.

Figure 8:
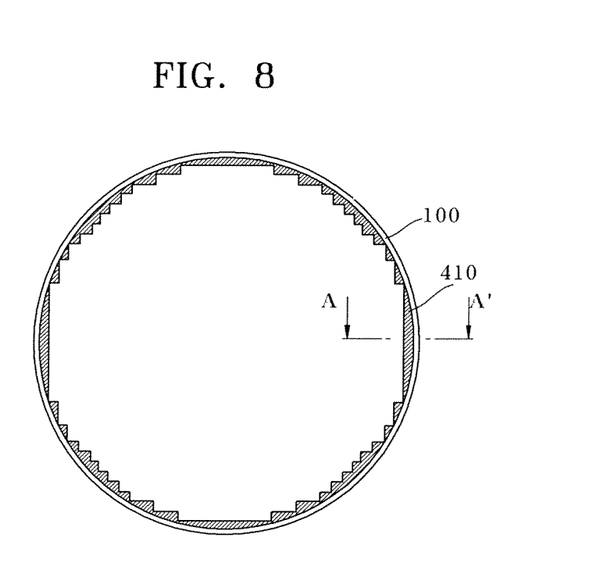
Figure 9:
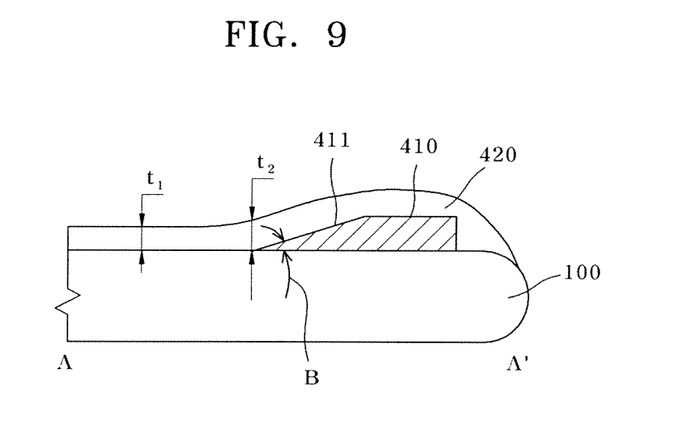

Referring to FIG. 8, a fence 410 is formed on the portion of the wafer 100 corresponding to the fence region 401. As illustrated in FIG. 9 (illustrating a section taken along a line A-A' of FIG. 8), the fence 410 is formed to have a sloped face 411 on the edge portion of the wafer 100 before a first photoresist layer 420 to be used as an etch mask 140 is coated on the sacrificial layer (130 of FIG. 5). At this time, the sloped face 411 is formed so as to be directed to the center of the wafer 100, and a slope angle B has the slope which reduce a fluctuation in the thickness of the second photoresist layer. For example, the sloped face 411 of the fence 410 is gently formed so as to have a slope less than about 45°.

When coating the first photoresist layer formed to cover the fence 410 on the wafer 100 formed with the sacrificial layer (130 of FIG. 5) for forming the etch mask 140, a thickness t1 of the first photoresist layer 420 is increased to a thickness t2 in the vicinity of the fence 410 by the influence of the height of the fence 410. However, when the first photoresist layer 420 is a positive resist for an ArF light source, the first photoresist layer 420 is formed to the thickness t1 of less than 100 nm. Since an effective defocus range is no more than 150 nm in an ArF exposure, it is possible to prevent exposure failure from being generated during the exposure process when the thickness t2 is restricted to less than 150 nm. The sloped face 411 of the fence 410 restricts the thickness t2 of the first photoresist layer 420 from being sharply increased and thus induces the thickness t2 of the first photoresist layer 420 to be maintained to less than 150 nm.

Figure 10:
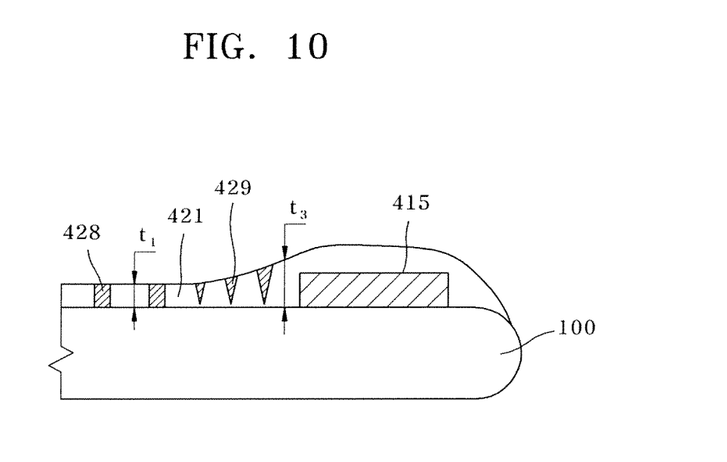
FIGS. 10 and 11 are exemplary views illustrating an effect of pattern defect inhibition by the pattern inhibition fence.

As illustrated in FIG. 10, when considering a fence 415 having a small sloped face and thus having a vertical side wall which actually falls sharply, a thickness t3 of the first photoresist layer 421 in the vicinity of the fence 415 can be increased up to 400 nm, although t1 is 100 nm, when the thickness of the fence 415 is assumed to be about 300 nm. When considering that a maximum defocus range allowed by the construction of the equipment in the ArF exposure process is no more than 150 nm, normal exposure on the first photoresist layer 421 in the region having the thickness t3 is actually impossible.

When exposing pattern 428 for providing an opening hole for the storage node on the first photoresist layer 421, the pattern 428 can be exposed with a required critical dimension (CD) of the pattern in a portion having a normal thickness t1, but the pattern 428 can be formed with a smaller size than the required CD, and thus result in formation of a poor pattern 429 in the portion having the thicker thickness t3 in the vicinity of the fence 415. Otherwise, the patterning may not be actually completed in this portion. When a poor pattern 429 is generated by the exposure failure as described above, defects can also be generated in the opening hole to be formed in an etch process using this poor pattern 429 as an etch mask, including defects such as the opening hole being formed smaller than the required CD, a CD of a bottom is not ensured or the bottom is not exposed.

Figure 11:
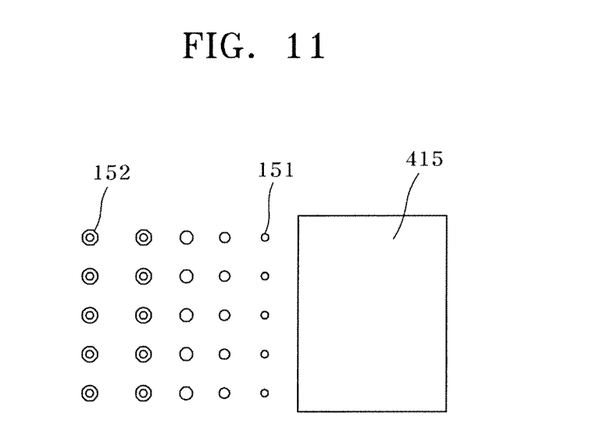

In this case, as illustrated in FIG. 11, the storage node 151 formed to fill the opening hole cannot ensure a contact area with the storage node contact therebelow to a required degree, and thus the defect 152 of a falling down storage node 151 or loss of the storage node 151 can be generated. That is to say, the storage node defect 152 in the vicinity of the fence 415 by the exposure failure is exhibited in the form of various defects 63, 65, 67, as described with reference to FIG. 3. When considering a flowability of the photoresist layer, since the slope limit of the first photoresist layer 421 is about 15°, a portion having such an increased thickness that generates the exposure failure reaches to a thickness of about 1000 nm. When assuming that a distance between the storage node 151 and the fence 415 is about 500 nm and a distance between the storage nodes 151 is about 100 nm, the defect 152 can be generated in at least five rows of the storage nodes 151. To inhibit the defect by the introduction of the fence 415, the fence 410 is formed to have the sloped face 411 as illustrated in FIG. 5.

Figure 12:
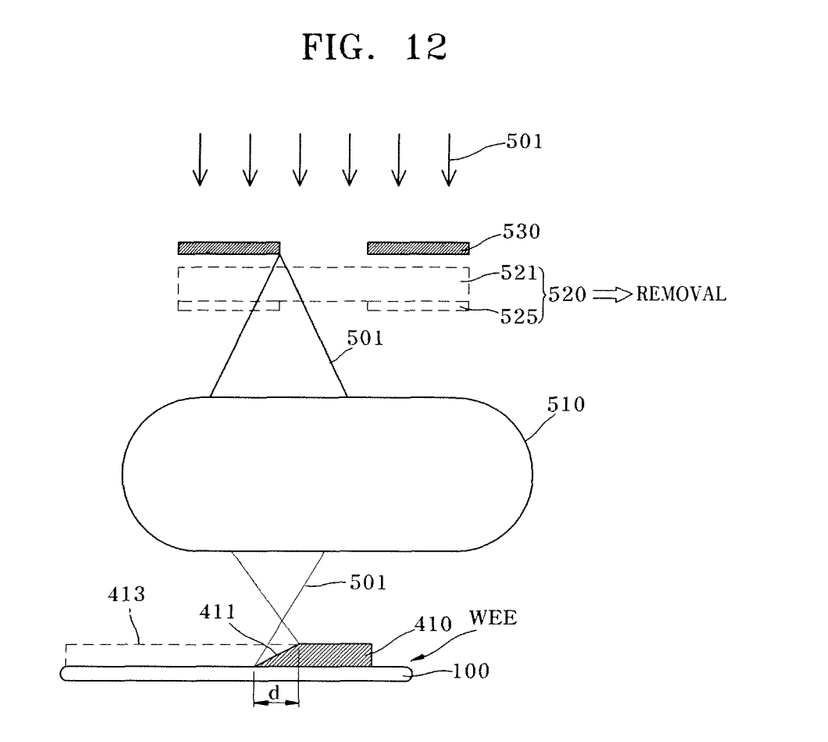
FIGS. 12 to 14 are exemplary views illustrating a process for inducing an inclined face on the pattern inhibition fence.

Referring to FIG. 12, a second photoresist layer 413 is coated on the wafer 100 formed with the sacrificial layer (130 of FIG. 5) and a Wafer Edge Exposure (WEE) is performed to remove the portion of the second photoresist layer 413 in the circumference of the wafer 100. After that, a first exposure process for exposing the fence region (401 of FIG. 7) is performed on the second photoresist layer 413. Since the first photoresist pattern actually forming the etch mask (140 of FIG. 5) is mainly formed of a positive resist, the second photoresist layer 413 is formed of a negative resist so that the second photoresist layer 413 can be maintained without being developed in a process of developing the positive resist.

It is also possible to form the second photoresist layer 413 with other resist materials other than the negative resist, provided that the material is a resist that can avoid being developed when the first photoresist pattern is developed. Nevertheless, since the fence region 401 is limited to the edge of the wafer 100, it is preferred to form the second photoresist layer 413 with a negative resist to reduce the time taken in the first exposure process. The second photoresist layer 413 is formed of an I line negative resist which can be exposed by an exposure equipment, e.g. I line exposure equipment, having an exposure resolution lower than that of the ArF exposure equipment, since the ArF exposure equipment is generally expensive. At this time, the I line negative resist is formed to a thickness of about 300 nm.

When performing the first exposure on the second photoresist layer 413 to form the fence 410, the defocus is induced with a very large width so as to induce the fence 410 to have the sloped face 411. However, the defocus range provided by the exposure equipment in which the exposure process is performed is insufficient to ensure the sloped face 411 on the fence 410. The exposure equipment has a structure such that a lens part 510 is disposed on the wafer and a photomask 520 is introduced to a path through which a first exposure light 501 is incident to the lens 510. The photomask 520 has a structure such that a mask pattern 525 is disposed on a transparent substrate 521, and thus a shape of the mask pattern 525 is transferred onto the wafer by the first exposure light 501. The defocus provided by a general exposure equipment can be made by relative position variation among the wafer 100, the photomask 520 and the lens part 510 and is no more than several μm, and a width of the sloped face formable by this defocus becomes actually no more than tens of nanometers.

The width d of the sloped face 411 of the fence 410 in accordance with the disclosed techniques should be hundreds of nanometers, for example, 500 to 1000 nm. This is because the sloped fence 411 should be gently sloped to inhibit the thickness fluctuation of the first photoresist layer 410 from being formed to cover the fence 410. However, it is difficult to ensure this sloped face 411 on the fence 410 with the defocus range allowed upon exposure using the photomask 520 in the exposure equipment. To ensure larger defocus, the photomask 520 is removed and a light shielding blade 530 is separately introduced above the position where the photomask 520 is introduced. Since the light shielding blade 530 can be introduced in the position at a greater distance from the wafer 100 than the position where the photomask 520 is introduced, it is possible to increase the defocus range to a scale of several millimeters. By the increase in the defocus, the defocus in the second photoresist layer 413 is increased up to hundreds of nanometers, and the side wall of the fence 410 is exposed to a sloped face 411 having a gentle slope.

Since the second photoresist layer 413 is formed of an I line negative resist, the exposure light 501 is introduced as an I line light. Since the first exposure for forming a fence 410 is performed by the I line light, it is possible to realize cost reduction by utilizing an I line exposure equipment.

Figure 13:
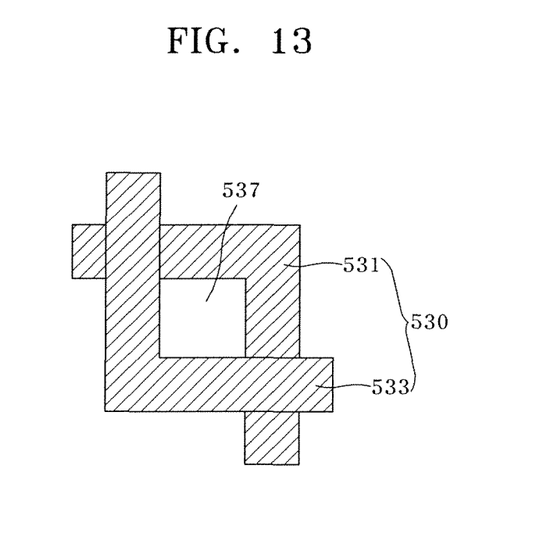
Figure 14:
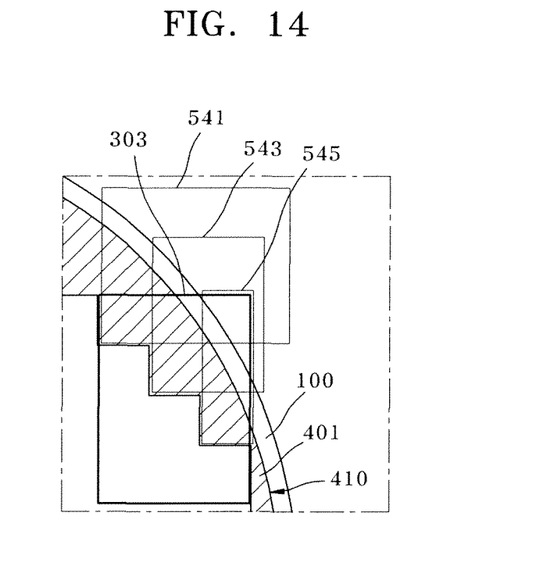

Referring to FIGS. 13 and 14, the light shielding blade 530 has first and second blades 531, 535 introduced and crossed with each other so as to provide a light transmitting region 537 on the wafer 100, and size and shape of the light transmitting region 537 can be varied by relative movement. As illustrated in FIG. 13, the first and second blades 531, 533 are combined so that a portion of the first photoresist layer 410 in the partial field region 303 is aligned with the set fence region 401, and first shot 541, second shot 543 and third shot 545 of the first exposure are sequentially provided, thereby capable of performing exposure in alignment with the fence region 401. After that, a development process is performed to form the fence 410 as illustrated in FIG. 9, and the first photoresist layer 420 is formed to cover the fence 410 by coating a positive resist for an ArF light source to about 100 nm.

Figure 15:
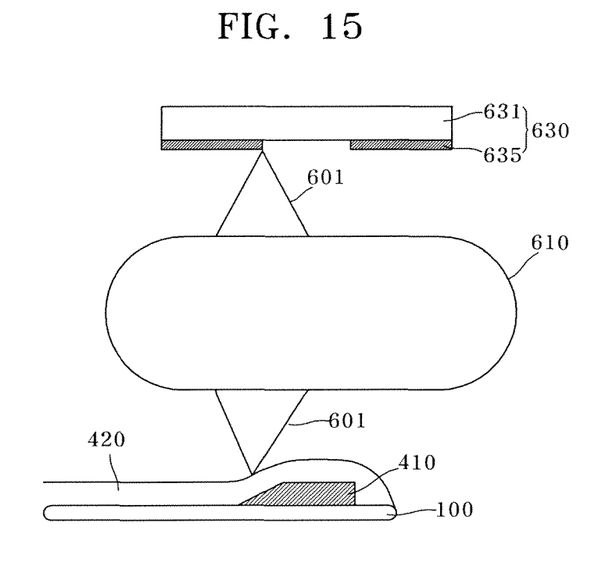
FIG. 15 is an exemplary view illustrating a process of exposing a photoresist layer.

Referring to FIG. 15, the wafer 100 coated with the first photoresist layer 420 is mounted below a lens part 610 for the ArF light source of the ArF exposure equipment, and the second exposure is performed using the second exposure light 601 of an ArF light. At this time, a photomask 630 provided with a mask pattern 635 is introduced in an incidence path of the second exposure light on the lens part 610. The mask pattern 635 provides a hole pattern (231 of FIG. 6) to be transferred on the wafer 100 to the light transmitting region of a substrate 631. The photomask 630 is configured so that the exposure on the entire region of the mask is performed as illustrated in FIG. 1.

This second exposure process is sequentially performed on all the exposure field regions 300 of the wafer map as illustrated in FIG. 7. That is to say, the second exposure process is performed so that entire mask field region (11 of FIG. 1) is exposed not only on the full field region 301 in the middle of the wafer 100, but also on the partial field region 303. It is not required to increase the number of the exposure shots more than the number of the partial field regions 303 to perform the second exposure on the partial field regions 303. Therefore, there is no need to separately divide and expose the partial field region 303, and it is not required a separately fabricated a photomask required for divisional exposure. It can be considered a method of dividing the partial field region 303 to divisional regions overlapped with the wafer 100 and separately exposing the divisional regions, but this divisional exposure requires division of the entire mask field region (11 of FIG. 1) for the divisional exposure and a plural number of divisional exposures can be required to expose one partial field region 303 by the divided regions. In the disclosed techniques, such a divisional exposure process is not required, and it is possible to perform the exposure with respect to the entire mask field region on the partial field region 303, thereby preventing an excessive increase in the time of the exposure process.

Figure 16:
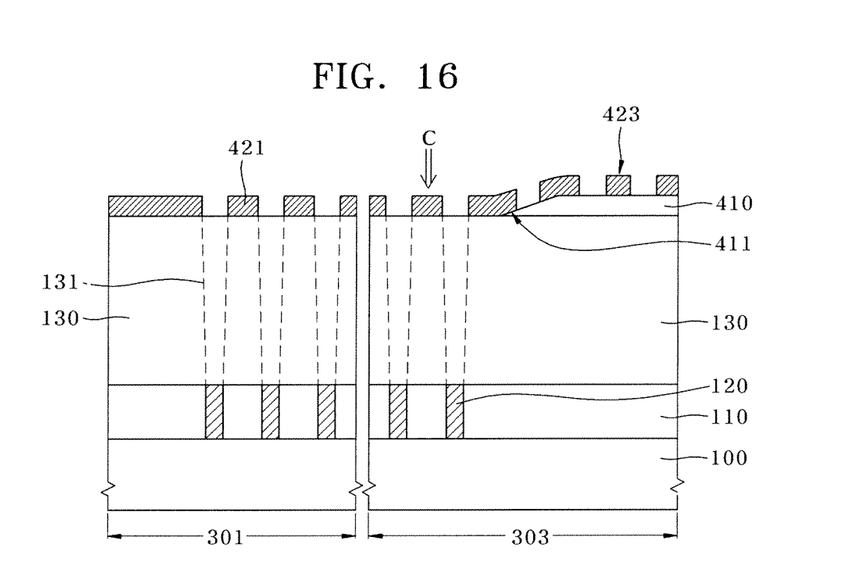
FIGS. 16 to 20 are an exemplary views illustrating a process of forming the storage node.

Referring to FIG. 16, the first photoresist layer 420 is subjected to the second exposure to form a first photoresist pattern 421 on the sacrificial layer 130. The first photoresist pattern 421 is formed as the etch mask (140 of FIG. 5) for selectively etching the opening hole 131 for giving a pillar shape to the storage node (150 of FIG. 5). At this time, the first photoresist pattern 421 can be patterned normally not only the full field region 301 of the wafer 100 but also on the partial field region 303 without defect by the second exposure. The fence 410 formed in the edge portion of the partial field region 303 is not removed, and is retained in a subsequent development process since it is not exposed upon the second exposure. The first photoresist patterns 423 exposed and developed on the fence 410 become dummy patterns 423, and are separated from the sacrificial layer 130 therebelow by the fence 410. Since the thickness fluctuation of the first photoresist layer 420 in the vicinity of the fence 410 is inhibited by the sloped face 411 of the fence 410, generation of exposure failure or the resulting pattern defect in the first photoresist pattern 421 placed in the vicinity C of the fence 410 is prevented.

Figure 17:
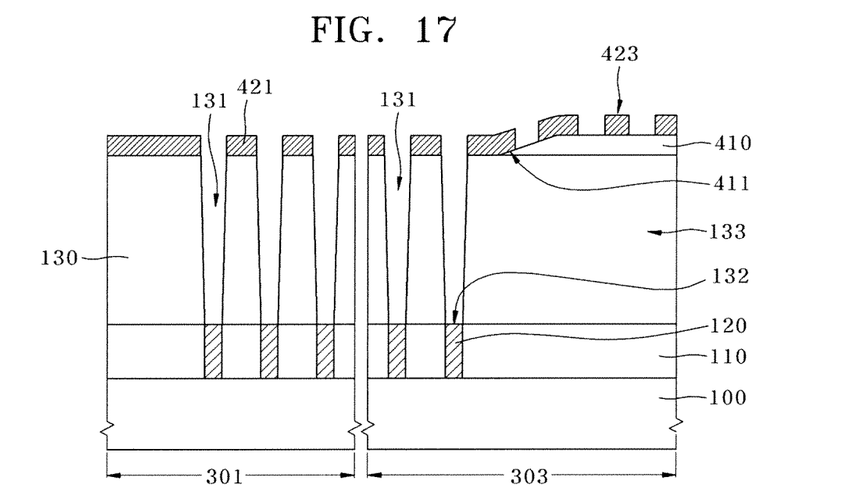

Referring to FIG. 17, a selective etch on the sacrificial layer 130 is performed using the first photoresist pattern 421 as the etch mask (140 of FIG. 5). Therefore, the opening holes passing through the sacrificial layer 130 are formed. Since the defect in the first photoresist pattern 421 in the partial field region 303 is prevented, the defect that the opening hole 131 on the partial field region 303 that is not normally opened is also prevented. Therefore, the CD of the bottom of the opening hole 131 on the partial field region 303 can be ensured. Meanwhile, since the dummy patterns 423 is in the state of being separated from the sacrificial layer 130 by the fence 410 and the fence 410 protects the portion of the sacrificial layer 133 therebelow upon the etch process, generation of poor opening hole according to the shape of the dummy pattern 423 is effectively inhibited.

Figure 18:
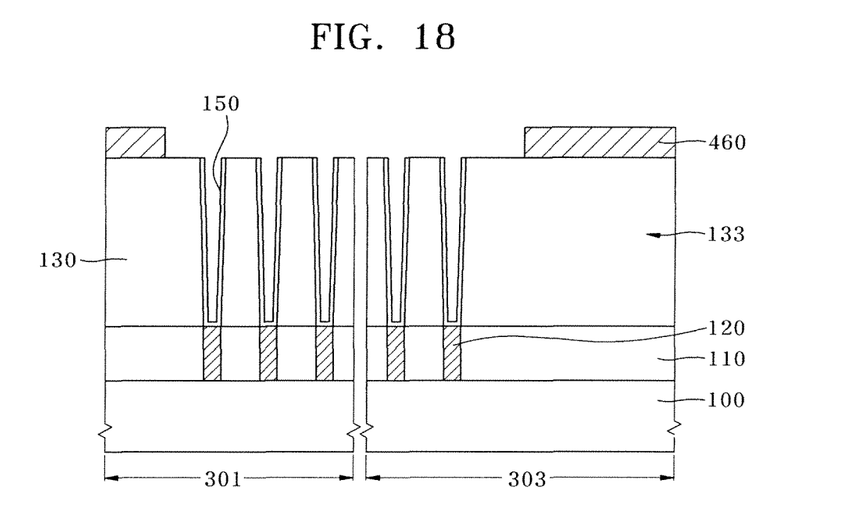

Referring to FIG. 18, after the first photoresist pattern 421 and the fence 410 are selectively removed, a conductive layer such as a titanium nitride (TiN) layer according to a profile of the opening hole 131 is deposited and planarized by Chemical Mechanical Polishing (CMP) to perform a node separation, thereby forming the storage node 150 having a cylindrical pillar. At this time, when depositing the conductive layer so as to completely fill the opening hole 131 and performing the node separation, a storage node having a circular pillar shape can be formed.

Figure 19:
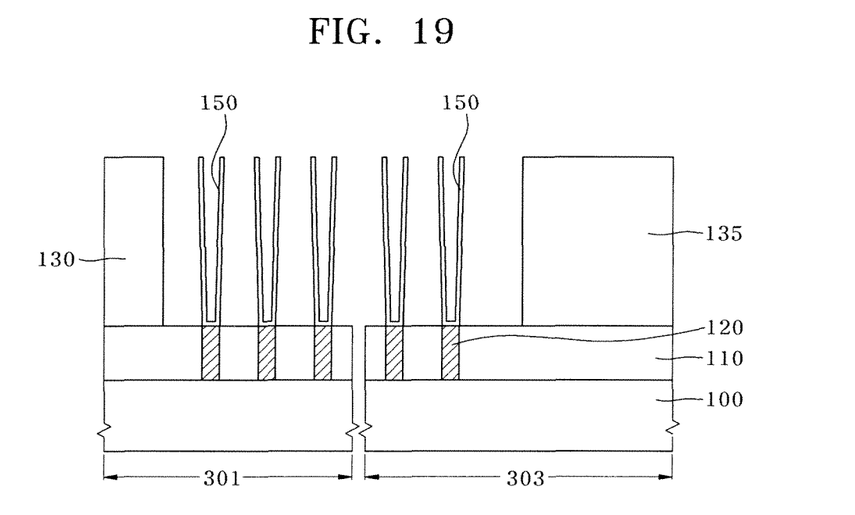

Referring to FIG. 19, a third photoresist pattern 460 is formed which selectively exposes the portion formed with the storage node 150, and the portion of the sacrificial layer 130 exposed by the third photoresist pattern 460 is selectively removed to expose outer side faces of the storage node 150. The portion of the sacrificial layer 131 on the peripheral region is retained as a first retained insulation layer 131 and a second remained insulation layer 135 can be retained on the portion formed with the fence 410.

Figure 20:
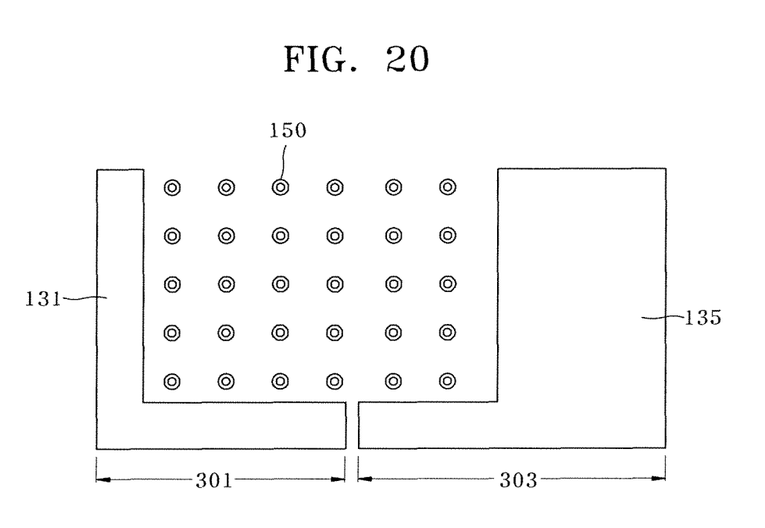

Referring to FIG. 20 together with FIG. 19, since pattern defects of the opening hole 131 in the vicinity of the fence (410 of FIG. 17) is inhibited by the introduction of the fence 410, generation of the defects in the storage node 150 formed in the opening hole 131 is also inhibited. Therefore, since it is possible to form a normal storage node 150 even in the partial field region 303, it is possible to integrate a capacitor in the partial field region 303. Consequently, it is possible to integrate a memory semiconductor device in the partial field region 303 and thus increase an yield of the memory device chip per wafer 100.

While the present invention has been described with respect to the specific embodiments, it will be apparent to those of ordinary skill in the art that various changes and modifications may be made without departing from the spirit and scope of the invention as defined in the following claims.

What is claimed is:

1. A method for forming patterns on a wafer, comprising:
   forming a fence having a sloped face in an edge portion of the wafer, wherein the sloped face is directed to an inside of the wafer;
   forming a first photoresist layer which extends to cover the fence on the wafer;
   forming first photoresist patterns by performing a first exposure and development on the first photoresist layer; and
   performing an etch process using the first photoresist patterns and the fence as an etch mask.

2. The method of claim 1, further comprising:
   forming on the wafer a sacrificial layer to provide a pillar shape to a storage node before forming the fence;
   forming an opening hole which passes through the sacrificial layer by the etch process; and
   forming the storage node so as to have a cylindrical pillar shape according to a profile of the opening hole or a circular pillar shape which fills the opening hole.

3. The method of claim 1, wherein forming the fence comprises forming the fence to include a second photoresist which resists the development of the first photoresist layer and is not developed when the first photoresist pattern is developed.

4. The method of claim 3, wherein the second photoresist comprises a negative resist and the first photoresist layer comprises a positive resist.

5. The method of claim 1, wherein the forming of the fence comprises:
   forming the second photoresist layer on the wafer; and
   performing a second exposure which intentionally induces a defocus to the second photoresist layer and forming the fence, wherein the sloped face is induced by the defocus.

6. The method of claim 5, wherein performing a second exposure comprises performing a second exposure which intentionally induces the defocus to a value larger than a thickness of the second photoresist layer.

7. The method of claim 5, wherein performing a second exposure comprises performing a second exposure which intentionally induces the defocus to a range of several millimeters.

8. The method of claim 5, wherein the second exposure comprises:
   providing the wafer below a lens part of an exposure equipment;
   providing a light shielding blade for opening a portion to be formed with the fence above the lens part; and
   performing the second exposure, wherein the defocus to the second photoresist layer results from providing an exposure light through the light shielding blade.

9. The method of claim 8, wherein providing a light shielding blade comprises providing a light shielding blade comprising two blade parts which control a width of a portion to be formed with the fence with an opened region.

10. The method of claim 8, wherein performing the second exposure comprises performing the second exposure by excluding the introduction of a photomask between the light shielding blade and the lens part, and increasing the defocus by a spacing between the introduction position of the light shielding blade and a position to be introduced with the photomask.

11. The method of claim 1, wherein forming the fence comprises:
    forming a second photoresist layer on the wafer;
    preparing a photomask comprising a mask field region to be pattern transferred on the first photoresist layer;
    setting, on the basis of the wafer, a map of exposure field regions to which an exposure shot on the mask field region is to be performed upon the first exposure;
    dividing the exposure field regions to full field regions on which the entire mask field region is to be fully transferred and partial field regions on which some is to be transferred; and
    performing a second exposure on the second photoresist layer so that the fence is disposed in the vicinity of the edge end of the wafer in the partial field region.

12. The method of claim 11, wherein performing the first exposure comprises performing the first exposure so that the entire mask field region is transferred on the partial field region by one exposure shot.

13. A method for forming patterns on a wafer, comprising:
    forming a first photoresist layer on the wafer;
    providing the wafer below a lens part of an exposure equipment;
    providing a light shielding blade for opening an edge portion of the wafer above the lens part;
    forming a fence in an edge portion of the wafer by performing a first exposure which results in a defocus to the first photoresist layer by providing an exposure light through the light shielding blade, wherein the fence comprises a sloped face directed to an inside of the wafer;
    forming a second photoresist layer on the wafer formed with the fence;
    forming second photoresist patterns by performing a second exposure and development on the second photoresist layer; and
    performing an etch process using the second photoresist patterns and the fence.

14. The method of claim 13, further comprising:
    forming on the wafer a sacrificial layer to provide a pillar shape to a storage node before forming the fence;
    forming an opening hole which passes through the sacrificial layer by the etch process; and
    forming the storage node so as to have a cylindrical pillar shape according to a profile of the opening hole or a circular pillar shape which fills the opening hole.

15. The method of claim 13, wherein performing the first exposure comprises performing the first exposure by excluding the introduction of a photomask between the light shielding blade and the lens part, and increasing the defocus by a spacing between the introduction position of the light shielding blade and a position to be introduced with the photomask.

16. The method of claim 13, wherein forming the fence comprises:
    preparing a photomask comprising a mask field region to be pattern transferred on the second photoresist layer by the second exposure;
    setting, on the basis of the wafer, a map of exposure field regions to which an exposure shot on the mask field region is to be performed upon the second exposure;
    dividing the exposure field regions to full field regions on which the entire mask field region is to be fully transferred and partial field regions in the edge portion of the wafer, on which only some is to be transferred; and
    performing the first exposure by disposing the light shielding layer so that the fence is disposed in the edge end of the wafer in the partial field region.

17. A method for forming patterns on a wafer, comprising:
    forming a sacrificial layer to provide a pillar shape to a storage node on the wafer;
    forming a first photoresist layer on the sacrificial layer;
    providing the wafer below a lens part of an exposure equipment;
    providing a light shielding blade for opening an edge portion of the wafer above the lens part;
    forming a fence in an edge portion of the wafer by performing a first exposure which results in a defocus to the first photoresist layer by providing an exposure light through the light shielding blade, wherein the fence comprises a sloped face directed to an inside of the wafer;
    forming a second photoresist layer on the wafer formed with the fence;
    forming second photoresist patterns by performing a second exposure and development on the second photoresist layer;
    forming opening holes passing through the sacrificial layer by performing an etch process using the second photoresist patterns and the fence; and
    forming storage nodes according to a profile of the opening hole.

18. The method of claim 17, wherein forming storage nodes comprises forming a storage node comprising a cylindrical pillar shape according to the profile of the opening hole or a circular pillar shape which fills the opening hole.

19. The method of claim 17, wherein performing the first exposure comprises performing the first exposure by excluding the introduction of a photomask between the light shielding blade and the lens part, and increasing the defocus by a spacing between the introduction position of the light shielding blade and a position to be introduced with the photomask.

20. The method of claim 17, wherein forming the fence comprises:
    preparing a photomask comprising a mask field region to be pattern transferred on the second photoresist layer by the second exposure;
    setting, on the basis of the wafer, a map of exposure field regions to which an exposure shot on the mask field region is to be performed upon the second exposure;
    dividing the exposure field regions to full field regions on which the entire mask field region is to be fully transferred and partial field regions in the edge portion of the wafer, on which only some is to be transferred; and
    performing the first exposure by disposing the light shielding layer so that the fence is disposed in the edge end of the wafer in the partial field region.

\* \* \* \* \*